United States Patent
Kim et al.

(10) Patent No.: US 8,222,663 B2
(45) Date of Patent: Jul. 17, 2012

(54) LIGHT EMITTING DEVICE AND METHOD OF MANUFACTURING THE SAME

(75) Inventors: Kyoung-kook Kim, Suwon-si (KR);
Su-hee Chae, Suwon-si (KR);
Young-soo Park, Yongin-si (KR); Taek Kim, Seongnam-si (KR); Moon-seung Yang, Hwaseong-si (KR); Hyung-su Jeong, Yongin-si (KR); Jae-chul Park, Seoul (KR); Jun-youn Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 391 days.

(21) Appl. No.: 12/458,797

(22) Filed: Jul. 23, 2009

(65) Prior Publication Data

US 2010/0123158 A1    May 20, 2010

(30) Foreign Application Priority Data

Nov. 18, 2008    (KR) ......................... 10-2008-0114754

(51) Int. Cl.
*H01L 33/00* (2010.01)
(52) U.S. Cl. .................... 257/99; 257/E33.057
(58) Field of Classification Search ............... 257/99, 257/E33.057
See application file for complete search history.

(56) References Cited

U.S. PATENT DOCUMENTS

| | | | |
|---|---|---|---|
| 6,287,882 B1 | 9/2001 | Chang et al. | |
| 6,562,648 B1 | 5/2003 | Wong et al. | |
| 2003/0122141 A1 | 7/2003 | Wong et al. | |
| 2006/0226434 A1 | 10/2006 | Hata | |
| 2007/0292978 A1 | 12/2007 | Yeh et al. | |
| 2008/0003777 A1 | 1/2008 | Slater et al. | |
| 2008/0135859 A1 | 6/2008 | Cho et al. | |
| 2008/0210969 A1 | 9/2008 | Yuan et al. | |
| 2008/0290349 A1 | 11/2008 | Takahashi | |
| 2010/0123158 A1* | 5/2010 | Kim et al. .................... 257/99 |

FOREIGN PATENT DOCUMENTS

| | | |
|---|---|---|
| JP | 11-307875 | 11/1999 |
| JP | 2004-235506 | 8/2004 |
| JP | 2004-235509 | 8/2004 |
| JP | 2005-019424 | 1/2005 |
| JP | 2005-347714 | 12/2005 |
| JP | 2007-173369 | 7/2007 |
| KR | 10-2005-0098213 | 10/2005 |
| KR | 10-2007-0018235 | 2/2007 |
| KR | 10-2008-0047836 | 5/2008 |
| KR | 10-2008-0047838 | 5/2008 |
| KR | 10-0858362 | 9/2008 |

OTHER PUBLICATIONS

European Search Report dated Apr. 28, 2011 for EP Application No. 09175236.0.

* cited by examiner

*Primary Examiner* — Mark Prenty
(74) *Attorney, Agent, or Firm* — Harness, Dickey & Pierce, P.L.C.

(57) ABSTRACT

Provided is a light emitting diode (LED) manufactured by using a wafer bonding method and a method of manufacturing a LED by using a wafer bonding method. The wafer bonding method may include interposing a stress relaxation layer formed of a metal between a semiconductor layer and a bonding substrate. When the stress relaxation layer is used, stress between the bonding substrate and a growth substrate may be offset due to the flexibility of metal, and accordingly, bending or warpage of the bonding substrate may be reduced or prevented.

11 Claims, 7 Drawing Sheets

LIGHT EMITTING DEVICE AND METHOD OF MANUFACTURING THE SAME

CROSS-REFERENCE TO RELATED APPLICATIONS

This application claims priority under 35 USC §119 to Korean Patent Application No. 10-2008-0114754, filed on Nov. 18, 2008, in the Korean Intellectual Property Office (KIPO), the entire contents of which are incorporated herein by reference.

BACKGROUND

1. Field

Example embodiments relate to a light emitting device (LED) manufactured by using a wafer bonding method, and to a method of manufacturing a LED using a wafer bonding method.

2. Description of the Related Art

Light emitting diodes (LEDs) including a semiconductor material, e.g., a Group III nitride semiconductor, or a Zn—Mg—O-based semiconductor material, may be made relatively small and light and have a relatively long lifetime. Various technologies have been developed to increase the efficiency of LEDs. Recently, in order to use a LED as a conventional lighting device, research on high-output and high-brightness LEDs has been conducted. However, because of the structure of a LED, when high-power is supplied to a LED, the efficiency of the LED decreases as compared to a case where low-power is supplied to a LED.

Thus, a vertical type LED having an efficient current application structure has been proposed. Unlike a horizontal type LED in which a part of a semiconductor layer is etched and an electrode is formed in the etched part, the vertical type LED may be directly located in an upper surface and a lower surface of the semiconductor layer. Accordingly, the vertical type LED has improved efficiency and higher output as compared to the horizontal LED. The vertical type LED is also more easily cooled as compared to the horizontal type LED, because heat generated during operation thereof is more easily radiated to the outside.

On the other hand, in the case of the vertical type LED, because an electrode should be located in upper and lower surfaces of a semiconductor layer, the vertical type LED requires a different manufacturing process from the horizontal type LED. For example, after a semiconductor layer is grown on a growth substrate, e.g., sapphire, the growth substrate is removed in order to perform subsequent processes. Before removing the growth substrate, plating (via a plating method) or wafer bonding (via a wafer bonding method) is performed with respect to the semiconductor layer so as to stably fix the semiconductor layer from which the growth substrate is to be removed.

When plating is used, difficulties may arise in performing the entire process due to a decrease in flatness and solidity of the plated metal thin film. When wafer bonding is used, a crack may occur in the semiconductor layer during a cooling process performed after wafer bonding, due to a difference of expansion coefficients of the growth substrate, e.g., sapphire, and a new bonding substrate. Also, the entire structure of the semiconductor layer may bend or warp.

SUMMARY

Example embodiments include a light emitting device (LED) manufactured by using a wafer bonding method that reduces bending or warpage, and to a method of manufacturing a LED using a wafer bonding method. Additional aspects will be set forth in part in the description which follows and, in part, will be apparent from the description, or may be learned by practice of example embodiments.

According to example embodiments, a LED may include a semiconductor layer including an active region for emitting light and a first electrode; a second electrode on the semiconductor layer; and a first stress relaxation layer bonded to a surface of the first electrode and formed of a metal.

The LED may further include a bonding substrate under the first stress relaxation layer. The LED may further include a bonding material layer between the first electrode and the first stress relaxation layer and between the first stress relaxation layer and the bonding substrate. The bonding material layer may have a thickness in the range of about 0.5 μm to about 3 μm. The first stress relaxation layer may be formed of a material having a melting point greater than the bonding material layer.

The LED may further include a second stress relaxation layer between the first stress relaxation layer and the bonding substrate and formed of a metal. The LED may further include a bonding material layer between the first electrode and the first stress relaxation layer and between the first stress relaxation layer and the second stress relaxation layer.

The bonding substrate may be a conductive substrate. The LED may further include a first bonding metal layer under the bonding substrate and a second bonding metal layer on the second electrode. The bonding substrate may be a nonconductive substrate having a thermal expansion coefficient in the range of about $4 \times 10^{-6}$ Å/K to about $8 \times 10^{-6}$ Å/K. The bonding substrate may be a glass substrate.

The LED may further include a first bonding metal layer configured to electrically connect to the first electrode on side portions of the semiconductor layer, and a second bonding metal layer on the second electrode. The LED may further include the first bonding metal layer under the first stress relaxation layer and the second bonding metal layer on the second electrode.

The first stress relaxation layer may include at least one selected from the group consisting of chrome (Cr), nickel (Ni), tin (Sn), molybdenum (Mo), titanium (Ti), copper (Cu), and an alloy thereof. The first stress relaxation layer may be formed to have a thickness in the range of about 10 μm to about 1 mm.

According to example embodiments, a method of manufacturing a LED may include forming a semiconductor layer on a growth substrate and including an active region for emitting light and a first electrode; bonding a bonding substrate to a surface of the first electrode; removing the growth substrate; and processing the semiconductor layer, wherein a first stress relaxation layer formed of a metal is bonded between the first electrode and the bonding substrate.

The first stress relaxation layer may be bonded by interposing a bonding material layer between the first electrode and the first stress relaxation layer and between the first stress relaxation layer and the bonding substrate. A second stress relaxation layer formed of a metal may be further bonded between the first stress relaxation layer and the bonding substrate.

The first and second stress relaxation layers may be bonded by interposing the bonding material layer between the first electrode and the first stress relaxation layer and between the first stress relaxation layer and the second stress relaxation layer. The second stress relaxation layer may be on the bonding substrate.

The first stress relaxation layer may be bonded by interposing the bonding material layer between the first electrode and the first stress relaxation layer, and in example embodiments, the first stress relaxation layer may be on the bonding substrate. The method may further include removing the bonding substrate. Processing the semiconductor layer may include forming a second electrode on the semiconductor layer.

BRIEF DESCRIPTION OF THE DRAWINGS

Example embodiments will be more clearly understood from the following detailed description taken in conjunction with the accompanying drawings. FIGS. 1-8B represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Reference will now be made in detail to example embodiments, examples of which are illustrated in the accompanying drawings, wherein like reference numerals refer to the like elements throughout. In this regard, example embodiments may have different forms and should not be construed as being limited to the descriptions set forth herein. Accordingly, example embodiments are merely described below, by referring to the figures, to explain aspects of the present description. In the drawings, the thicknesses and the widths of layers are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
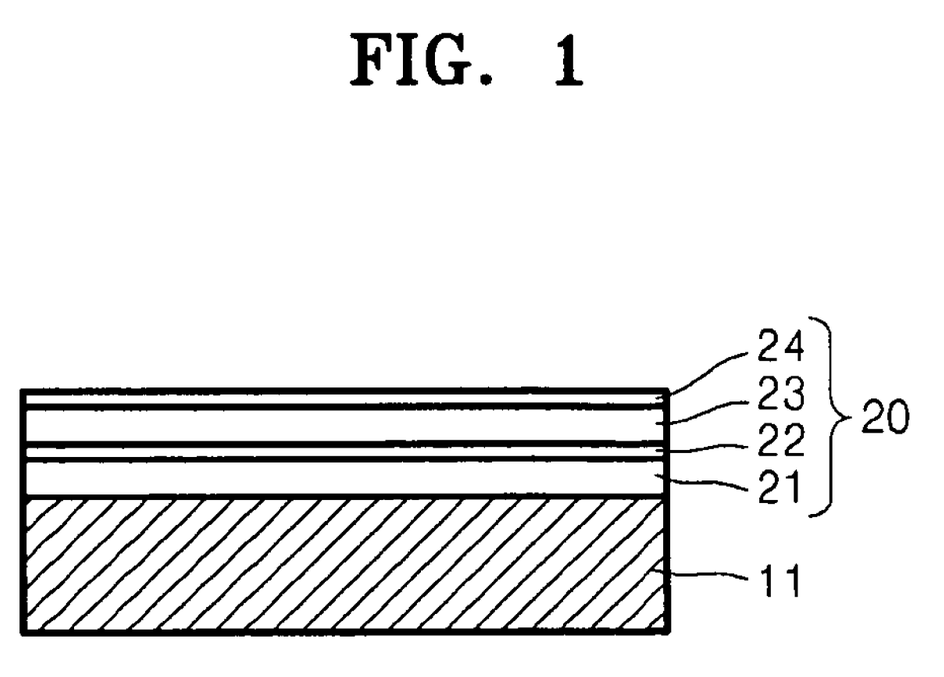
FIG. 1 is a schematic cross-sectional view illustrating a structure in which a semiconductor layer is grown on a growth substrate, according to example embodiments.

Referring to FIG. 1, a first semiconductor layer 21, an active layer 22, and a second semiconductor layer 23 may be sequentially grown on a growth substrate 11, and a first electrode 24 may be grown on the second semiconductor layer 23. The growth substrate 11 may be a sapphire substrate. The first semiconductor layer 21, the active layer 22, and the second semiconductor layer 23 may be formed of a semiconductor material, e.g., a Group III nitride semiconductor which is a combination of GaN—AlN—InN or a Zn—Mg—O-based semiconductor material. The first semiconductor layer 21 may be an n-semiconductor layer doped with an n-type material, and the second semiconductor layer 23 may be a p-semiconductor layer doped with a p-type material. The active layer 22, which is an active region for generating light by recombination of electrons and holes, may have a single- or multi-quantum well structure. The first electrode 24 may be a p-type electrode when the second semiconductor layer 23 is a p-semiconductor layer.

Although not shown in FIG. 1, a buffer layer for improving crystal quality may be additionally interposed between the growth substrate 11 and the first semiconductor layer 21. Also, although not shown in FIG. 1, to form a plurality of LED chips on one growth substrate 11, the first semiconductor layer 21, the active layer 22, the second semiconductor layer 23, and the first electrode 24 may be partially etched and divided into a plurality of regions. Because the above process may be the same as a conventional LED manufacturing process, its detailed description will be omitted.

Before performing the subsequent process for manufacturing a LED, a bonding substrate may be bonded to a structure illustrated in FIG. 1 according to a wafer bonding method. Various example embodiments regarding bonding of the bonding substrate to the structure illustrated in FIG. 1 will now be described. Hereinafter, the first semiconductor layer 21, the active layer 22, the second semiconductor layer 23, and the first electrode 24 will be referred to as a semiconductor layer 20 for convenience. Accordingly, in the following description of drawings, only one layer denoted as the semiconductor layer 20 will be illustrated for convenience.

Figure 2:
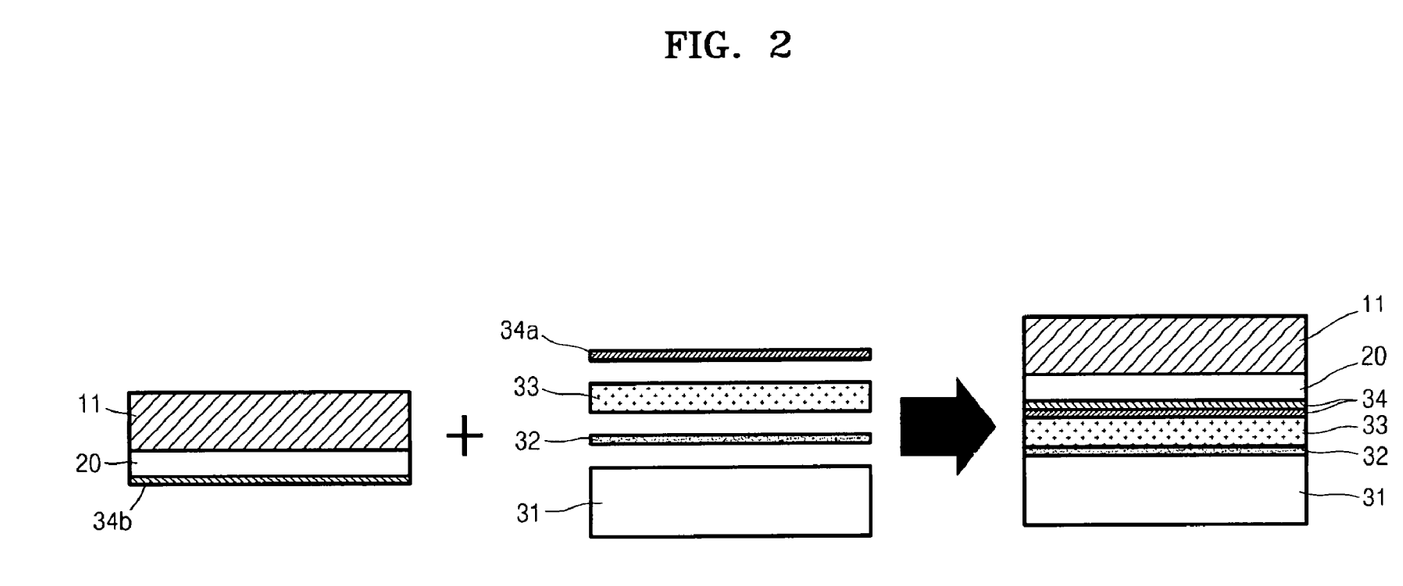
FIG. 2 is a schematic cross-sectional view illustrating a process for bonding a semiconductor layer to a bonding substrate, according to example embodiments.

FIG. 2 is a schematic cross-sectional view illustrating a process for bonding the semiconductor layer 20 of FIG. 1 to a bonding substrate 31, according to example embodiments. As described above, when a wafer bonding method is used, bending or warpage may occur due to a difference of the thermal expansion coefficients between the growth substrate 11 and the bonding substrate 31 during the cooling process. As illustrated in FIG. 2, according to example embodiments, in order to ease or prevent bending or warpage, an additional stress relaxation layer 33 formed of a metal sheet may be between the semiconductor layer 20 and the bonding substrate 31. For example, a bonding material layer 32 may be interposed between the bonding substrate 31 and the stress relaxation layer 33, and a bonding material layer 34 may be interposed between the stress relaxation layer 33 and the semiconductor layer 20. The bonding material layers 32 and 34 may be melted to bond these layers.

Bonding material layers 34a and 34b may be respectively coated on a surface of the stress relaxation layer 33 and a surface of the semiconductor layer 20 which face each other, and the bonding material layers 34a and 34b may be melted to form the bonding material layer 34 and bond the stress relaxation layer 33 to the semiconductor layer 20. In FIG. 2, the growth substrate 11 and the semiconductor layer 20 are illustrated in reversed positions as compared to the illustration of FIG. 1. In more detail, the bonding material layer 34 may be interposed between the first electrode 24 and the stress relaxation layer 33, and accordingly, the stress relaxation layer 33 may be bonded onto a surface of the first electrode 24.

According to example embodiments, because the stress relaxation layer 33 absorbs a difference of thermal expansion coefficients between the bonding substrate 31 and the growth substrate 11, bending or warpage may be eased or prevented during the cooling process after the bonding process. For this, a material formed of a metal sheet having improved flexibility may be used as the stress relaxation layer 33.

When a metal sheet having flexibility is interposed between the bonding substrate 31 and the growth substrate 11, even if the bonding substrate 31 and the growth substrate 11 contract differently during the cooling process, the bonding substrate 31 and the growth substrate 11 may not affect each other due to the flexibility of the metal sheet interposed therebetween. In order to enable the difference of the thermal expansion coefficients between the bonding substrate 31 and the growth substrate 11 and to be sufficiently absorbed, the stress relaxation layer 33 needs to be thick enough. For example, the stress relaxation layer 33 formed of the metal sheet may be formed to have a thickness in the range of about 10 µm to about 1 mm, and more particularly, from about 50 µm to about 300 µm.

The stress relaxation layer 33 may have electrical conductivity so as to transmit a current that is applied from the outside to the semiconductor layer 20. The stress relaxation layer 33 may also have a melting point greater than the bonding material layers 32 and 34 so as not to be transformed in the bonding process. A material for forming the stress relaxation layer 33 satisfying the above conditions may be chrome (Cr), nickel (Ni), tin (Sn), molybdenum (Mo), titanium (Ti), copper (Cu), or an alloy thereof. In FIG. 2, the stress relaxation layer 33 is illustrated as a single-layer, but may be formed in a multi-layered structure in which a plurality of layers each formed of different material are stacked.

The bonding material layers 32 and 34 may be formed of a eutectic bonding material, for example, an AuSn alloy or an AuGe alloy having electrical conductivity. The bonding material layers 32 and 34 may be formed by e-beam deposition, atomic layer deposition (ALD), chemical vapor deposition (CVD), or physical vapor deposition (PVD), and the bonding material layers 32 and 34 may be formed to have thicknesses in the range of about 0.5 to about 3 µm. The stress relaxation layer 33 may be bonded to both the bonding substrate 31 and the semiconductor layer 20 by melting the bonding material layers 32 and 34. The AuSn alloy has a melting point of about 280° C., and the AuGe alloy has a melting point above about 300° C. Conventionally, in order to minimize or reduce bending or warpage during a cooling process, the AuSn alloy, which is relatively melted at a low temperature, is mainly used as a bonding material.

In example embodiments, a low-temperature thermal treatment less than about 300° C. may be performed in order to prevent or reduce transformation of a bonding material in the thermal treatment for a stable operation of a LED. On the other hand, in example embodiments, because bending or warpage may be prevented or reduced through the stress relaxation layer 33, an AuGe alloy having a relatively high melting point may be used as the bonding material layers 32 and 34. Because a high-temperature thermal treatment above about 300° C. may be performed in the subsequent thermal treatment process of a LED, quality and operation stability of the LED may be improved.

The bonding substrate 31 may generally use a silicon substrate having conductivity. However, the bonding substrate 31 is not limited to the silicon substrate, and various substrates formed of various materials may be used. For example, the bonding substrate 31 may be a nonconductive substrate, e.g., a glass substrate, and the nonconductive substrate may be formed of a material having a thermal expansion coefficient in the range of about $4 \times 10^{-6}$ Å/K to about $8 \times 10^{-6}$ Å/K.

Figure 3:
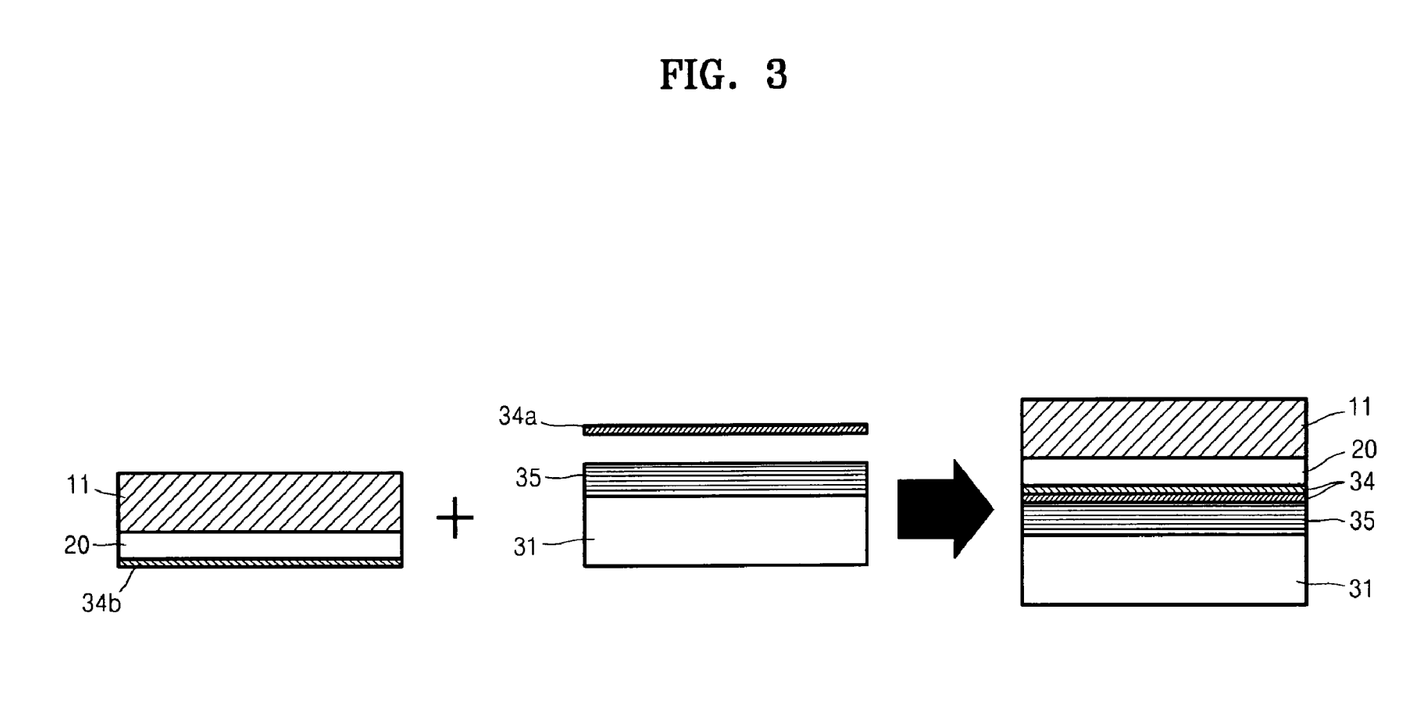
FIG. 3 is a schematic cross-sectional view illustrating a process for bonding the semiconductor layer of FIG. 1 to a bonding substrate, according to example embodiments.

FIG. 3 is a schematic cross-sectional view illustrating a process for bonding the semiconductor layer of FIG. 1 to a bonding substrate, according to example embodiments. FIG. 3 is different from FIG. 2 in that a stress relaxation layer is not bonded to the bonding substrate 31 by using a bonding material layer, and the stress relaxation layer 35 is directly deposited or grown on the bonding substrate 31. As for the other descriptions, example embodiments described in FIG. 2 may be the same as example embodiments described in FIG. 3. Accordingly, in example embodiments, the stress relaxation layer 35 which is previously formed on the bonding substrate 31 may be bonded to a surface of the semiconductor layer 20 through the bonding material layer 34.

Figure 4:
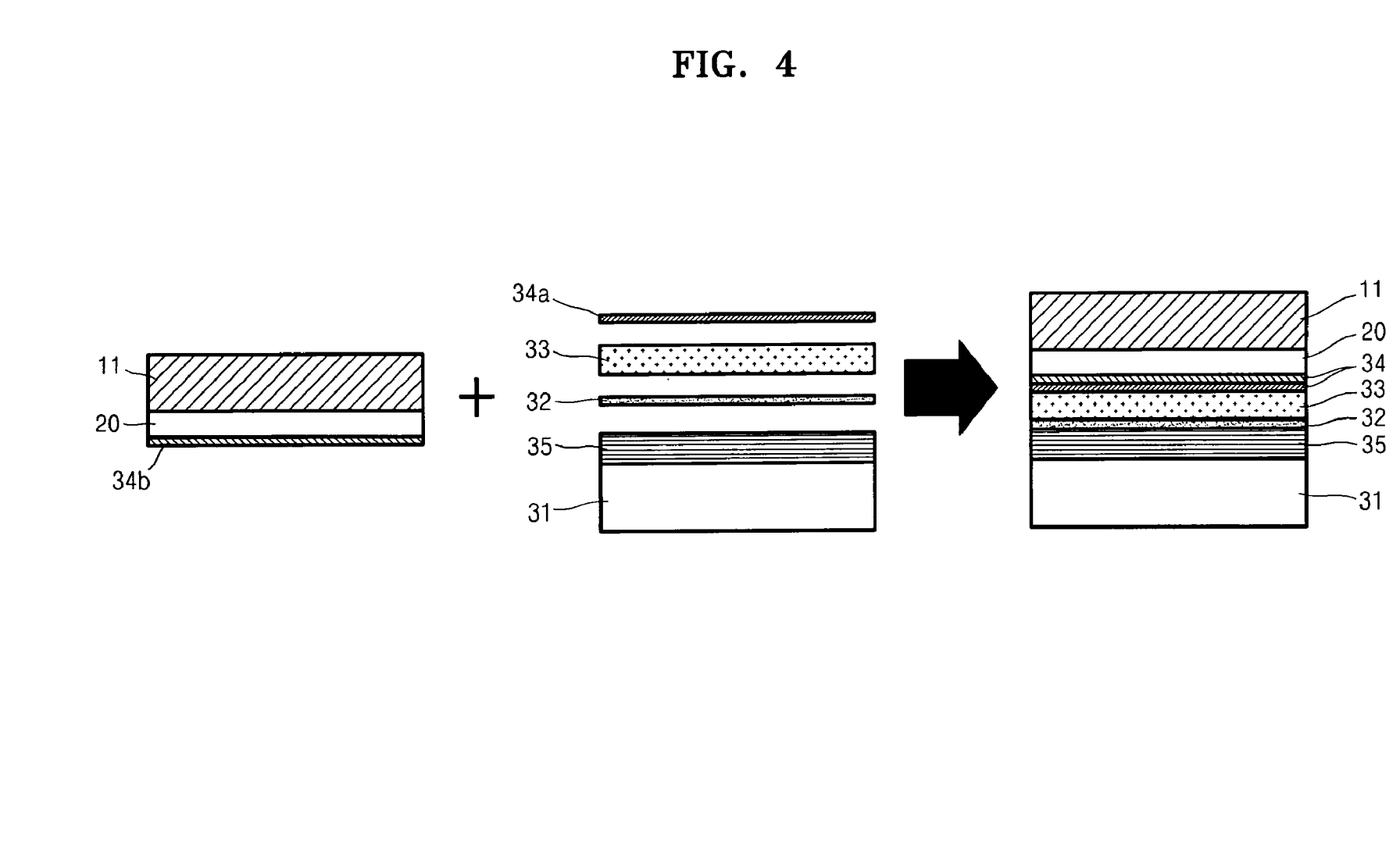
FIG. 4 is a schematic cross-sectional view illustrating a process for bonding the semiconductor layer of FIG. 1 to a bonding substrate, according to example embodiments.

FIG. 4 is a schematic cross-sectional view illustrating a process for bonding the semiconductor layer of FIG. 1 to a bonding substrate, according to example embodiments. The example embodiment illustrated in FIG. 4 includes both example embodiments illustrated in FIGS. 2 and 3. That is, as illustrated in FIG. 4, the first stress relaxation layer 33 may be bonded to the surface of the semiconductor layer 20 by interposing the bonding material layer 34 between the first stress relaxation layer 33 and the semiconductor layer 20. At the same time, the first stress relaxation layer 33 may be bonded to the bonding substrate 31 by interposing the bonding material layer 32 between the first stress relaxation layer 33 and the bonding substrate 31 in which the second stress relaxation layer 35 is deposited on the surface of the bonding substrate 31.

The bonding material layers 34a and 34b may be respectively coated on a surface of the first stress relaxation layer 33 and a surface of the semiconductor layer 20, and the bonding material layers 34a and 34b may be melted to form the bonding material layer 34 and bond the stress relaxation layer 33 to the semiconductor layer 20. Thus, the second stress relaxation layer 35, the bonding material layer 32, the first stress relaxation layer 33, the bonding material layer 34, the semiconductor layer 20, and the growth substrate 11 may be sequentially stacked on the bonding substrate 31.

In this structure, because two stress relaxation layers 33 and 35 are disposed between the semiconductor layer 20 and the bonding substrate 31, bending or warpage may be further reduced. The first and second stress relaxation layers 33 and 35 may be formed of the same material or different materials. Also, the stress relaxation layers 33 and 35 may be formed to have the same thickness or different thicknesses.

Figure 5:
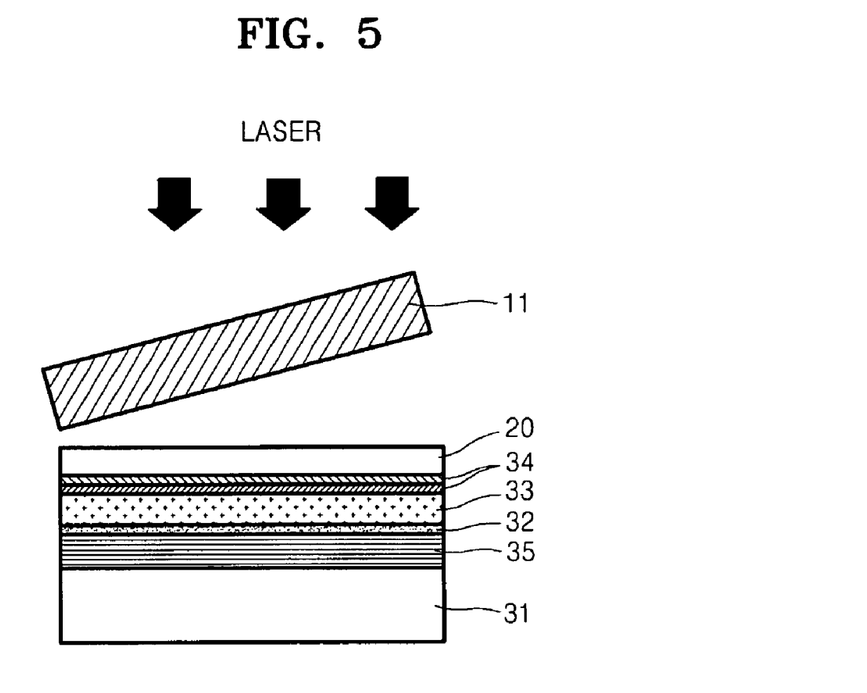
FIG. 5 is a schematic cross-sectional view illustrating a process for removing a growth substrate through a lift-off process after bonding the bonding substrate of FIG. 4, according to example embodiments.

After the semiconductor layer 20 and the bonding substrate 31 are bonded using a wafer bonding method illustrated in FIG. 2 or FIG. 4, as illustrated in FIG. 5, the growth substrate 11 may be removed using a laser lift-off (LLO) method. The semiconductor layer 20 may be externally exposed. In particular, referring to FIG. 1, the first semiconductor layer 21 of the semiconductor layer 20 is externally exposed.

After the growth substrate 11 is removed, a LED may be completed by processing the semiconductor layer 20 according to the conventional subsequent process. For example, a surface of the semiconductor layer 20 may be partially etched or cleaned via an etching method. Also, texturing for forming a geometrical relief structure may be performed on the surface of the semiconductor layer 20 in order to increase light extraction efficiency. A second electrode may be formed on the surface of the semiconductor layer 20.

Figure 6:
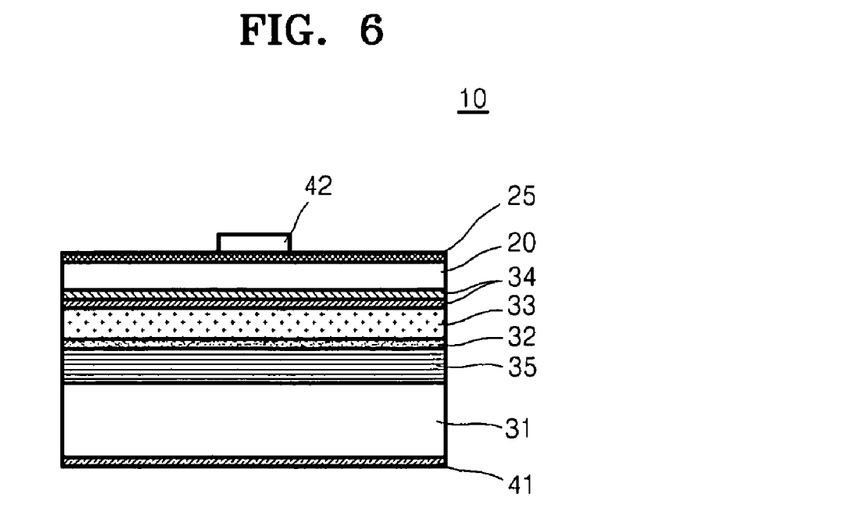
FIG. 6 is a schematic cross-sectional view illustrating a light emitting diode (LED) completed through the subsequent process after removing the growth substrate, according to example embodiments.

FIG. 6 is a schematic cross-sectional view illustrating a LED completed through the subsequent process after removing the growth substrate, according to example embodiments. FIG. 6 illustrates the LED 10 obtained by performing the subsequent process with respect to the structure of FIG. 4. However, FIG. 6 may also relate to the structures formed according to example embodiments described in FIGS. 2 and 4. Referring to FIG. 6, a second electrode 25 may be disposed on the surface of the semiconductor layer 20. For example, when the first semiconductor layer 21 illustrated in FIG. 1 is an n-semiconductor layer, the second electrode 25 is an n-type electrode. The second electrode 25 may also be a transparent electrode transmitting light, and the second electrode 25 may be formed of indium tin oxide (ITO).

A first bonding metal layer 41 may be disposed under the bonding substrate 31, and a second bonding metal layer 42 may be disposed on the second electrode 25. The first and second bonding metal layers 41 and 42 may be coupled with a wire (not shown) connected to a lead frame of a package (not shown) when packaging a completed LED. Accordingly, a current applied through the wire from the lead frame may be respectively sent to the first and second electrodes 24 and 25 through the first and second bonding metal layers 41 and 42. In example embodiments, the bonding substrate 31 may be formed of a conductive substrate, e.g., silicon.

As described above, the bonding substrate 31 may be a nonconductive substrate. In example embodiments, the first bonding metal layer 41 may not be disposed under the bonding substrate 31.

Figure 7A:
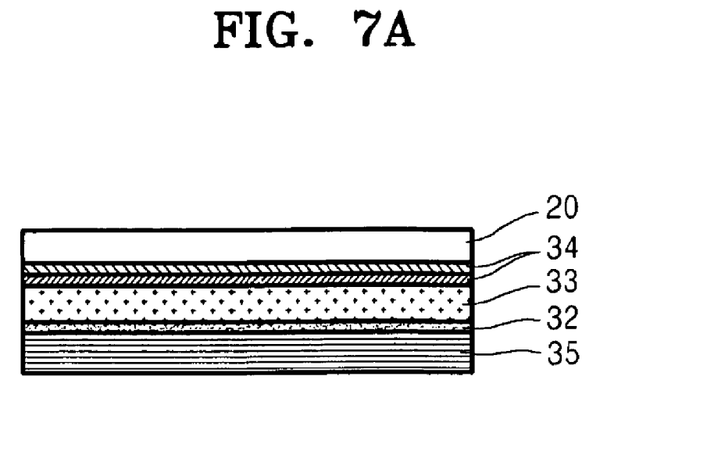
FIGS. 7A and 7B are schematic cross-sectional views illustrating a process for manufacturing a LED after removing the growth substrate, according to example embodiments.
Figure 7B:
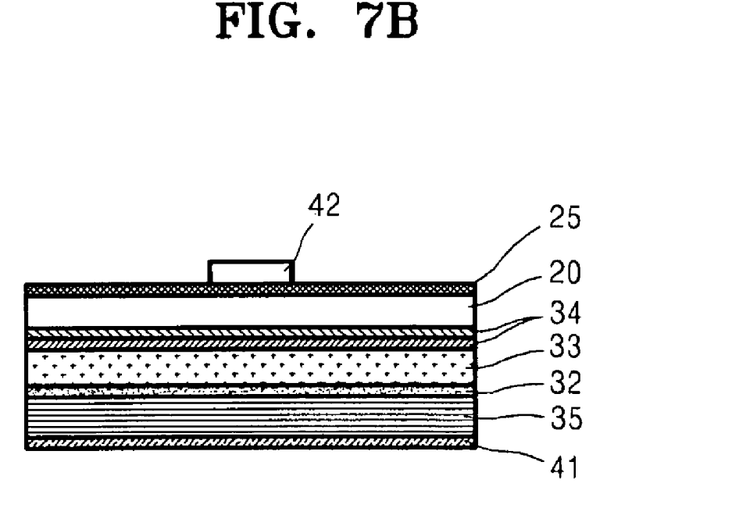

FIGS. 7A and 7B illustrate a bonding substrate 31 that is a nonconductive substrate, according to example embodiments. FIGS. 7A and 7B illustrate a LED obtained by performing the subsequent process with respect to the structure formed according to example embodiments described in FIG. 4, but FIGS. 7A and 7B may also relate to the structures formed according to example embodiments described in FIGS. 2 and 3.

As illustrated in FIG. 7A, after the semiconductor layer 20 is processed, the bonding substrate 31 may be removed. The bonding substrate 31 may be more easily removed by polishing, e.g., chemical mechanical polishing (CMP), and only first and second stress relaxation layers 33 and 35 remain under the semiconductor layer 20. As illustrated in FIG. 7B, after the second electrode 25 is formed, the first bonding metal layer 41 may be disposed under the second stress relaxation layer 35, and the second bonding metal layer 42 may be disposed on the second electrode 25. A current applied to the first bonding metal layer 41 may be sent to the first electrode 24 (see FIG. 1) of the semiconductor layer 20 through the second stress relaxation layer 35, the bonding material layer 32, the first stress relaxation layer 33, and the bonding material layer 34, and may be sent to the second semiconductor layer 23 (see FIG. 1) through the first electrode 24 again. A current applied to the second bonding metal layer 42 may also be sent to the first semiconductor layer 21 (see FIG. 1) through the second electrode 25.

Figure 8A:
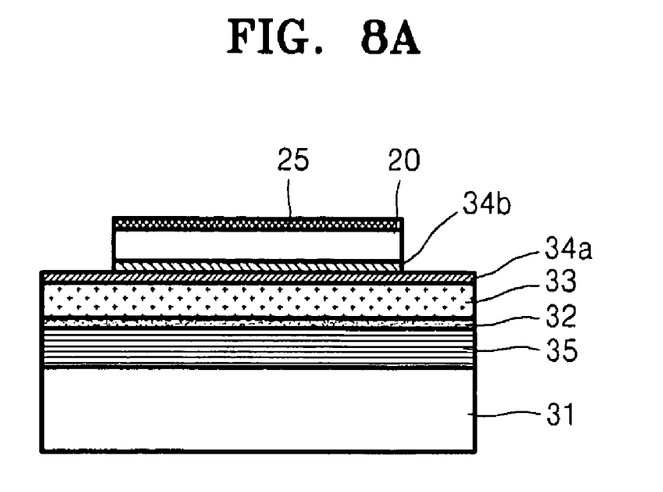
FIGS. 8A and 8B are schematic cross-sectional views illustrating a process for manufacturing a LED after removing the growth substrate, according to example embodiments.
Figure 8B:
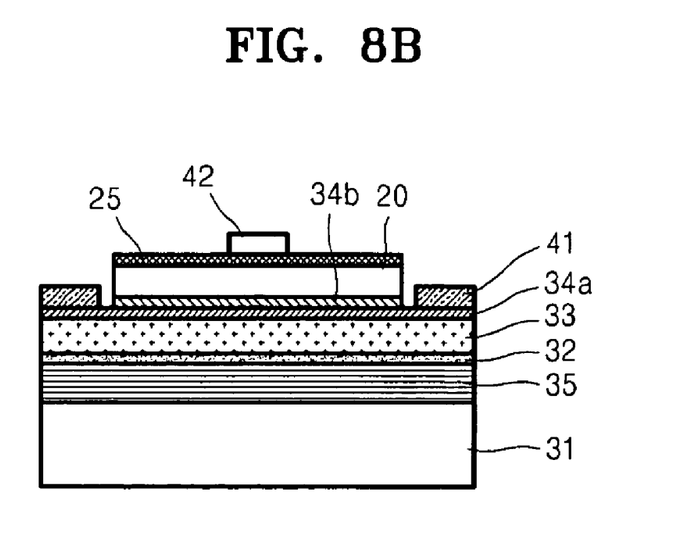

FIGS. 8A and 8B illustrate a bonding substrate 31 that is a nonconductive substrate, according to example embodiments. FIGS. 8A and 8B are schematic cross-sectional views illustrating a process for manufacturing a LED after removing the growth substrate, according to example embodiments. As described above, FIGS. 8A and 8B illustrate a LED obtained by performing the subsequent process with respect to the structure formed according to example embodiments described in FIGS. 2 and 3.

Referring to FIG. 8A, after the semiconductor layer 20 is processed and the second electrode 25 is formed, both edge portions of each of the semiconductor layer 20 and the second electrode 25 are etched and thus removed. Both edge portions of the semiconductor layer 20 may be completely removed to expose a part of the bonding material layers 34a and 34b. For example, the etching process may be performed until the bonding material layer 34a attached onto the first stress relaxation layer 33 is exposed. Alternatively, the etching process may be performed to expose only a part of the first electrode 24 (see FIG. 1) by removing up to the second semiconductor layer 23 of the semiconductor layer 20.

As illustrated in FIG. 8B, the first bonding metal layer 41 may be disposed on both side portions of the semiconductor layer 20, and the second bonding metal layer 42 may be disposed on the second electrode 25. In FIG. 8B, the first bonding metal layer 41 may be disposed on both side portions of the semiconductor layer 20, but the first bonding metal layer 41 may be formed in a ring-shape surrounding the circumference of the semiconductor layer 20. In example embodiments, the first bonding metal layer 41 may be electrically connected to the first electrode 24 through the bonding material layer 34.

Alternatively, the first bonding metal layer 41 may directly contact the first electrode 24 and be electrically connected to the first electrode 24. In FIG. 8B, the bonding material layer 34a may remain on the first stress relaxation layer 33, and the first bonding metal layer 41 may be formed on the bonding material layer 34a. In example embodiments, a current applied to the first bonding metal layer 41 may be sent to the first electrode 24 through the bonding material layers 34a and 34b. However, under different conditions, an etching process may be performed until a part of the first electrode 24 is exposed, and the first bonding metal layer 41 may be formed on the first electrode 24.

It should be understood that these example embodiments described therein should be considered in a descriptive sense only, and not for purposes of limitation. Descriptions of features or aspects within each example embodiment should typically be considered as available for other similar features or aspects in other example embodiments.

What is claimed is:

1. A light emitting diode (LED) comprising:
   a semiconductor layer including an active region for emitting light and a first electrode;
   a second electrode on the semiconductor layer;
   a first stress relaxation layer bonded to a surface of the first electrode and formed of a metal;
   a bonding substrate under the first stress relaxation layer; and
   a bonding material layer between the first electrode and the first stress relaxation layer and between the first stress relaxation layer and the bonding substrate,
   wherein the bonding material layer is formed to have a thickness in the range of about 0.5 µm to about 3 µm.

2. A light emitting diode (LED) comprising:
   a semiconductor layer including an active region for emitting light and a first electrode;
   a second electrode on the semiconductor layer;
   a first stress relaxation layer bonded to a surface of the first electrode and formed of a metal;
   a bonding substrate under the first stress relaxation layer; and
   a bonding material layer between the first electrode and the first stress relaxation layer and between the first stress relaxation layer and the bonding substrate,
   wherein the first stress relaxation layer is formed of a material having a melting point greater than the bonding material layer.

3. A light emitting diode (LED) comprising:
   a semiconductor layer including an active region for emitting light and a first electrode;
   a second electrode on the semiconductor layer;
   a first stress relaxation layer bonded to a surface of the first electrode and formed of a metal;
   a bonding substrate under the first stress relaxation layer; and
   a second stress relaxation layer between the first stress relaxation layer and the bonding substrate and formed of a metal.

4. The LED of claim 3, further comprising:
   a bonding material layer between the first electrode and the first stress relaxation layer and between the first stress relaxation layer and the second stress relaxation layer.

5. A light emitting diode (LED) comprising:
   a semiconductor layer including an active region for emitting light and a first electrode;
   a second electrode on the semiconductor layer;
   a first stress relaxation layer bonded to a surface of the first electrode and formed of a metal;
   a bonding substrate under the first stress relaxation layer;
   a first bonding metal layer under the bonding substrate; and
   a second bonding metal layer on the second electrode,
   wherein the bonding substrate is a conductive substrate.

6. A light emitting diode (LED) comprising:
   a semiconductor layer including an active region for emitting light and a first electrode;
   a second electrode on the semiconductor layer;
   a first stress relaxation layer bonded to a surface of the first electrode and formed of a metal; and
   a bonding substrate under the first stress relaxation layer,
   wherein the bonding substrate is a nonconductive substrate having a thermal expansion coefficient in the range of about $4 \times 10^{-6}$ Å/K to about $8 \times 10^{-6}$ Å/K.

7. The LED of claim 6, wherein the bonding substrate is a glass substrate.

8. The LED of claim 6, further comprising:
   a first bonding metal layer configured to electrically connect to the first electrode on side portions of the semiconductor layer; and
   a second bonding metal layer on the second electrode.

9. The LED of claim 8, wherein the first bonding metal layer is under the first stress relaxation layer and the second bonding metal layer is on the second electrode.

10. A light emitting diode (LED) comprising:
    a semiconductor layer including an active region for emitting light and a first electrode;
    a second electrode on the semiconductor layer; and
    a first stress relaxation layer bonded to a surface of the first electrode and formed of a metal,
    wherein the first stress relaxation layer comprises at least one selected from the group consisting of chrome (Cr), nickel (Ni), tin (Sn), molybdenum (Mo), titanium (Ti), and an alloy thereof.

11. A light emitting diode (LED) comprising:
    a semiconductor layer including an active region for emitting light and a first electrode;
    a second electrode on the semiconductor layer; and
    a first stress relaxation layer bonded to a surface of the first electrode and formed of a metal,
    wherein the first stress relaxation layer is formed to have a thickness in the range of about 10 µm to about 1 mm.

* * * * *